(12) United States Patent
Quakernack et al.

(10) Patent No.: US 10,795,847 B2
(45) Date of Patent: Oct. 6, 2020

(54) COUPLER FOR AN AUTOMATION SYSTEM

(71) Applicant: WAGO Verwaltungsgesellschaft mbH, Minden (DE)

(72) Inventors: Frank Quakernack, Bielefeld (DE); Daniel Jerolm, Bad Essen (DE); Hans-Herbert Kirste, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 15/933,843

(22) Filed: Mar. 23, 2018

(65) Prior Publication Data

US 2018/0276170 A1    Sep. 27, 2018

(30) Foreign Application Priority Data

Mar. 23, 2017   (DE) ........................ 10 2017 002 806

(51) Int. Cl.
*G06F 13/40*  (2006.01)
*G06F 13/10*  (2006.01)
*G06F 13/28*  (2006.01)
*G11C 7/10*   (2006.01)

(52) U.S. Cl.
CPC ........ *G06F 13/4068* (2013.01); *G06F 13/102* (2013.01); *G06F 13/28* (2013.01); *G11C 7/1006* (2013.01)

(58) Field of Classification Search
CPC ........... H04L 12/4637; H04L 12/40006; H04L 41/00; G05B 2219/25174; G06F 13/4068; G06F 13/4027; G06F 13/102; G11C 7/1006

See application file for complete search history.

(56) References Cited

U.S. PATENT DOCUMENTS

| 7,852,857 | B2 | 12/2010 | Beckhoff et al. | |
| 2008/0130668 | A1* | 6/2008 | Balakrishnan | ........ H04L 47/521 370/412 |
| 2008/0131122 | A1* | 6/2008 | Reisslein | ............ H04J 14/0227 398/59 |
| 2009/0323727 | A1* | 12/2009 | Surek | .................... H04J 3/1658 370/503 |
| 2010/0111082 | A1* | 5/2010 | Janssen | ............... H04L 12/4625 370/389 |
| 2010/0211711 | A1 | 8/2010 | Kuschke et al. | |
| 2015/0365252 | A1* | 12/2015 | Bunte | ................. H04L 12/6418 709/208 |

FOREIGN PATENT DOCUMENTS

| EP | 1 590 927 B1 | 7/2006 |
| EP | 2 109 259 A1 | 10/2009 |

* cited by examiner

*Primary Examiner* — Ernest Unelus
(74) *Attorney, Agent, or Firm* — Muncy, Geissler, Olds & Lowe, P.C.

(57) ABSTRACT

A coupler for an automation system for controlling a process, having a first interface for connection to a field bus for receiving a field bus message with process data of the process, a second interface for connection to a local bus for transmitting a local bus message, and a circuit implemented between the first interface and the second interface. The circuit has a non-clocked logic circuit comprising a number of hardware logic elements. The non-clocked logic circuit is equipped to change process data received through the first interface. The circuit is equipped to output the changed process data in the local bus message.

20 Claims, 3 Drawing Sheets

COUPLER FOR AN AUTOMATION SYSTEM

This nonprovisional application claims priority under 35 U.S.C. § 119(a) to German Patent Application No. 10 2017 002 806.0, which was filed in Germany on Mar. 23, 2017, and which is herein incorporated by reference.

BACKGROUND OF THE INVENTION

Field of the Invention

The present invention relates to a coupler for an automation system.

Description of the Background Art

A field bus is a bus system that connects field devices in a system, such as transducers (sensors) and control elements (actuators), for the purpose of communication with an automation device. There are standardized protocols for the communication. Many different field bus systems with different characteristics have been established on the market. Since 1999, field buses have been standardized in the IEC 61158 standard (Digital data communication for measurement and control—Fieldbus for use in industrial control systems). The current generation of field bus technology is based on real-time Ethernet. Known field buses include Ethernet—/IP, PROFIBUS, PROFINET, and EtherCAT, for example.

Known from EP 1 590 927 B1, which corresponds to U.S. Pat. No. 7,852,857, is a coupler for a network with a ring topology and a network (field bus) that is based on Ethernet. In the case where the physical characteristics of the Ethernet network differ from those of the ring-like transmission path, a processing device is needed in the coupler in order to translate an Ethernet message from the physical characteristics of the Ethernet network to those of the ring-like transmission path. This processing device is arranged between the external interface and the internal interface of the coupler. In addition, the processing device can carry out necessary changes to the Ethernet message in order to guarantee the Ethernet standard for modified Ethernet messages sent on the transmission paths, for example by exchanging source and destination addresses and recalculating an Ethernet checksum.

Known from EP 2109259 A1, which corresponds to US 2010/0211711, is a method for process control in which data are exchanged through a bus coupler between a network (field bus) designed for transmitting Ethernet messages and a lower-level bus system. The bus coupler is connected to the network through a first interface and to the lower-level bus system through a second interface. Process data are read in and/or output by at least one node of the lower-level bus system. The method has the following steps:—receiving an Ethernet message through the first interface of the bus coupler;—converting the received first data message into a second data message, wherein the individual data for a plurality of the nodes connected to the lower-level bus system are transferred unchanged into the second data message from the data area of the first data message, and certain data contained in the first data message are not transferred; and—outputting the internal data message through the second interface of the bus coupler to the nodes of the lower-level bus system.

SUMMARY OF THE INVENTION

It is therefore an object of the present invention to provide a coupler that is more flexible to the greatest degree possible.

Accordingly, in an embodiment, a coupler for an automation system is provided. The automation system has, for example, a control center with a PLC (Programmable Logic Controller). The PLC can be connected by means of a field bus to a multiplicity of devices for controlling a process. Other automation systems may also be provided, however. The coupler connects a field bus to a local bus. To this end, the coupler has a first interface for connection to the field bus for receiving a field bus message with process data of the process to be controlled. The coupler can also be equipped to send process data of the process through the first interface to other devices connected to the field bus. According to an embodiment of the invention, the first interface has a connection mechanism (jack) and/or a first interface circuit.

In addition, the coupler has a second interface for connection to a local bus for transmitting a local bus message on the local bus. The coupler can be equipped to send process data of the process through the second interface to at least one local bus node connected to the local bus and/or to receive process data from at least one local bus node. The coupler can be equipped to generate the local bus message. The type of the first interface and the type of the second interface can differ from one another. Because of the different physical characteristics of the field bus and the local bus in this case, the coupler can be equipped to convert the field bus message from the physical characteristics of the field bus to the physical characteristics of the local bus. According to an exemplary embodiment of the invention, the second interface has a connection mechanism, for example in the form of metallic contacts and/or a second interface circuit. Furthermore, in other embodiments of the invention the coupler has additional electrical and/or mechanical functions.

The coupler has a circuit implemented between the first interface and the second interface. The circuit can be connected as a digital electronic circuit to the first interface and to the second interface. The circuit here is designed to perform functions of the coupler. The circuit is implemented on a circuit board, for example, and can be integrated into one or more semiconductor chips. This does not preclude the first interface and/or the second interface having an interface-specific interface circuit.

The circuit has a non-clocked logic circuit formed of a number of hardware logic elements. The non-clocked logic circuit can be implemented between two circuit regions of clocked logic of the circuit. The non-clocked logic circuit here has no clock input. The non-clocked logic circuit can be independent of a clock signal of a clock generator of the circuit. The non-clocked logic circuit can have a number (1 to K) of logic inputs and a number (1 to L) of logic outputs. When a change occurs in input signals to the logic inputs, the output signals computed by the non-clocked logic circuit at the logic outputs are output with almost no delay. Only the propagation delay of hardware logic elements creates a delay, although this is not significant if the sum of the delays of the hardware logic elements is smaller than the clock period of a clock signal of the circuit.

The non-clocked logic circuit is equipped to change the process data received through the first interface. In this regard, the change in the process data is based on a logic function of the non-clocked logic circuit, which is defined by the wiring of the hardware logic elements of the non-clocked logic circuit. The non-clocked logic circuit can be equipped to carry out the change within one clock period of a clock signal of the circuit. The circuit is equipped to output the changed process data in the local bus message on the local bus through the second interface.

According to an embodiment, the non-clocked logic circuit as a hardware logic element has an AND gate and/or an OR gate and/or an exclusive-OR gate and/or an inverter and/or a lookup table (LUT—Look Up Table). The non-clocked logic circuit can also have additional gates (AND, OR, etc.). In addition, the non-clocked logic circuit can also have other hardware logic elements. The non-clocked logic circuit can be implemented as gate logic.

According to an embodiment, the circuit is equipped to switch between changed process data and unchanged process data for output in the local bus message. This makes it possible for only a part of the process data to be changed, whereas a different part of the process data is transferred unchanged into the local bus message. The circuit can be equipped to generate a switchover signal for the switchover.

According to an embodiment, the circuit has a memory element. The circuit can have one memory element or multiple memory elements. The memory element is a RAM region or a buffer, for example. The memory element can be, for example, a FIFO (FIFO—First In First Out). The memory element can be implemented as a clocked register. An output of the non-clocked logic circuit can be connected to an input of the memory element. The circuit can be equipped to load the changed process data in the memory element and output the changed process data loaded in the memory element in the local bus message.

According to an embodiment, the output of the non-clocked logic circuit is connected to the input of the memory element via a switching unit, in particular a multiplexer. The switching unit can be equipped to switch between the non-clocked logic circuit and the input of the memory element, so a switchover takes place between the changing of the process data and a NON-changing of the process data. In this way, the circuit is equipped to change a part of the process data from a field bus message before output in the local bus message, while also outputting another part of the process data from a field bus message unchanged in the local bus message.

According to an alternative improvement, an output of the non-clocked logic circuit is connected to the input of the memory element. In this case, no switching unit is provided between the non-clocked logic circuit and the memory element. Only changed process data can be output. Alternatively, it is possible to provide two memory elements for changed process data and unchanged process data. Alternatively, a memory element, for example a FIFO, with two inputs for changed and unchanged process data can also be provided. Preferably, the memory element is clocked.

According to an embodiment, the circuit has a register. An output of the register is connected to an input of the non-clocked logic circuit. The register can be clocked, so current data can be present at the output of the register with a clock edge. The register can have a bit width equal to that of the memory element. The register can be equipped to generate a control signal (strobe) that can be output to a control input of the memory element.

According to an embodiment, the circuit has an additional register. Advantageously, the circuit can have a switching unit. A first input of the switching unit is connected to an output of the additional register. The circuit is equipped to switch between the output of the additional register and the output of the non-clocked logic circuit by means of a control signal at a control input of the switching unit. The circuit can be equipped to select the register or the additional register by means of different addresses and to selectively write at least sections of the received process data into the register or the additional register.

According to an embodiment, the circuit can have an M-bit wide parallel bus. For example, the parallel bus has a width of 32 bits. The register and/or the additional register are connected to the parallel bus. The circuit is equipped to copy at least sections of the received process data into the register and/or the additional register by means of the parallel bus.

According to an embodiment, the circuit has a controller, in particular a DMA controller (DMA—Direct Memory Access), for controlling the copying of the process data. The DMA controller is also referred to as a direct memory access controller. The DMA controller can be designed for addressing of the register and/or of the additional register.

An object of the invention is an automation system having at least one coupler.

An object of the invention is a method for operating a coupler for an automation system, having the steps: receiving a field bus message with process data through a first interface of the coupler, wherein the first interface is designed for connection to a field bus; transmitting a local bus message through a second interface of the coupler, wherein the second interface is designed for connection to a local bus; changing the process data received through the first interface by means of a non-clocked logic circuit formed of a number of hardware logic elements, wherein the non-clocked logic circuit is implemented in a circuit between the first interface and the second interface, and/or outputting the changed process data in the local bus message by means of the circuit.

According to an embodiment, the steps of the method can take place in a predetermined sequence. After the process data received with the field bus message are received, they can first be changed before the changed process data for transmission over the local bus are output in the local bus message. Still more steps in addition to the aforementioned can also be provided in the method.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
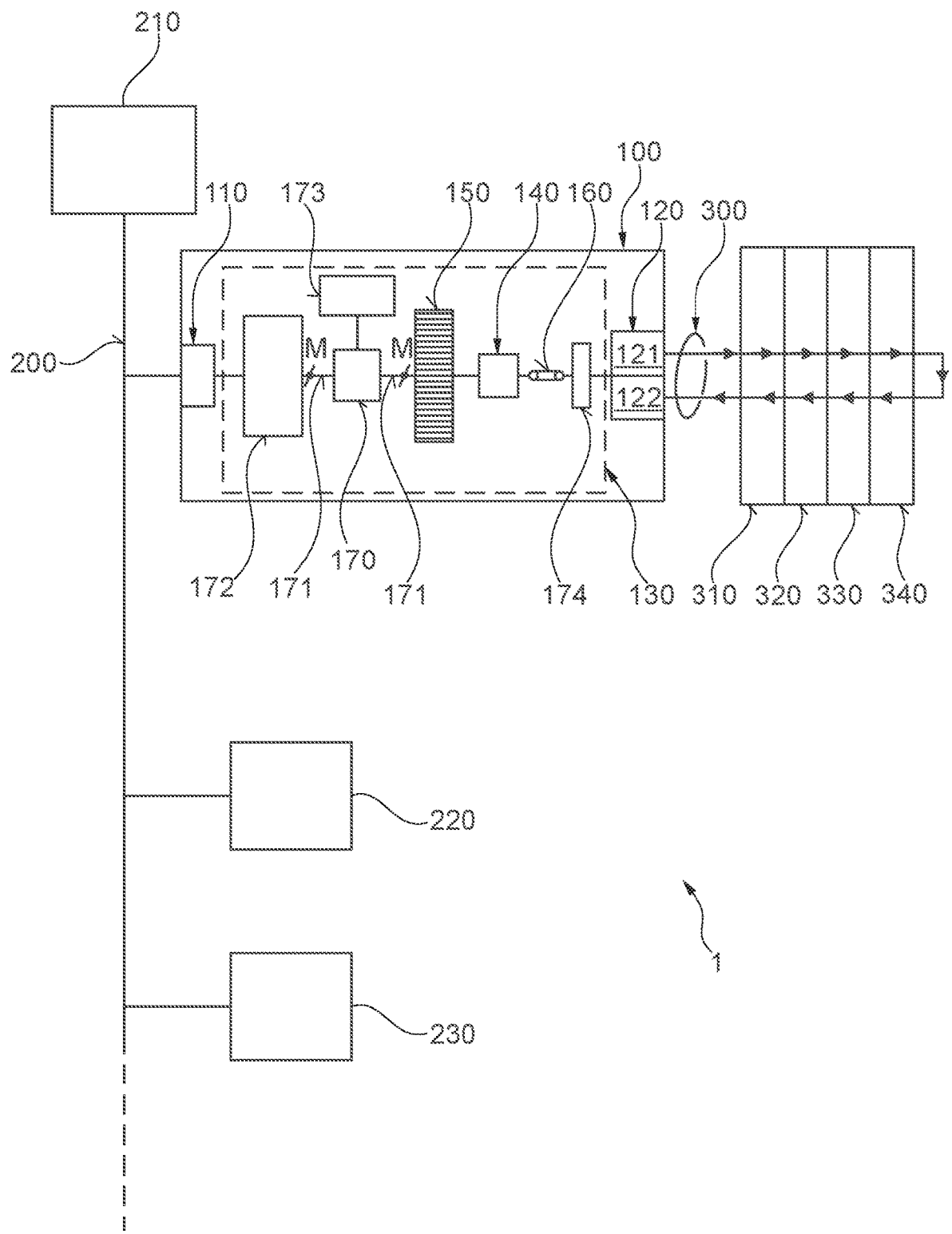
FIG. 1 is a schematic block diagram of an exemplary embodiment of an automation system with a coupler.

FIG. 1 shows a schematic block diagram of an automation system 1. The automation system 1 has a field bus 200, to which a coupler 100 is connected. The field bus 200 can be implemented, for example, as an Ethernet-based field bus 200, for example as an EtherCAT field bus or a PROFINET field bus. Automation tasks with real-time applications can also be fulfilled with an Ethernet-IP field bus 200. A twisted-pair cable with RJ45 plugs/jacks can serve as the physical transmission medium. The devices 210, 100, 220, 230 connected to the field bus 200 can be wired in series for low cabling effort. The field bus 200 can also have any other suitable topology, however. The field bus 200 can also be referred to as a network. The field bus 200 is designed to transmit field bus messages for communication among field bus nodes 100, 210, 220, 230. In the exemplary embodiment from FIG. 1, a PLC 210 is connected to the field bus 200, wherein the PLC 210 communicates with the nodes 100, 220, 230 in the automation system 1 over the field bus 200. The PLC 210 can be implemented as a control center, for example.

Shown in the exemplary embodiment from FIG. 1, is a coupler 100 that is connected to the field bus 200 and to a local bus 300. A local bus 300 can be understood here to mean, for example, a bus that is separate from the field bus 200. The local bus 300 has a different mode of transmission from the field bus 200. For example, the protocols used on the field bus 200 and the local bus 300 are different. In like manner, the physical characteristics of the field bus 200 and those of the local bus 300 may differ. In the exemplary embodiment from FIG. 1, the field bus devices 210, 220, 230 communicate with the local bus nodes 310, 320, 330, 340 exclusively through the coupler 100. The coupler 100 can also be referred to as a bus coupler. The local bus nodes 310, 320, 330, 340 can be arranged to be spatially remote from one another and from the coupler 100. Advantageously, the local bus nodes 310, 320, 330, 340 are arranged in the immediate vicinity of the coupler 100, however. The local bus nodes 310, 320, 330, 340 can have a mechanical mounting for attachment to one another and, in particular, to the coupler 100. In this way a compact unit can be created.

In the exemplary embodiment from FIG. 1, the local bus nodes 310, 320, 330, 340 have a small quantity of data so only a few data items are written or read. Consequently, a shared field bus message is used for the data of the local bus nodes 310, 320, 330, 340, which supplies the local bus nodes 310, 320, 330, 340 with process data. The coupler 100 has a first interface 110 for connection to the field bus 200. A field bus message with process data of the process can be received through the first interface 110. In addition, the coupler 100 has a second interface 120 for connection to the local bus 300. A local bus message 350 can be transmitted through the second interface 120. The coupler 100 thus acts as a connecting link between the field bus 200 and the local bus 300. In the exemplary embodiment from FIG. 1, the coupler 300 is configured as the master in the local bus system and the other local bus nodes 310, 320, 330, 340 are implemented as slaves.

In the implementation of the exemplary embodiment from FIG. 1, the field bus 200 can also be referred to as the primary bus or higher-level bus and the local bus 300 as the subordinate or lower-level bus. Advantageously, the local bus 300 is implemented as a logical ring bus structure, wherein a local bus message passes through the local bus nodes 310, 320, 330, 340 in order in the downstream direction and/or in the upstream direction and then returns to the coupler 100. The first interface 110 of the coupler 100 has contacts in the exemplary embodiment from FIG. 1, for example a jack, for connection to the field bus 200. In addition, the first interface 110 can have an interface circuit (TRX) for communication. The interface circuit can also be referred to as a transceiver circuit. The second interface 120 of the coupler 100 has contacts for connection to the local bus 300. In addition, the second interface 120 in the exemplary embodiment from FIG. 1, has an interface circuit with a transmitter circuit 121 (TX) for transmitting, and with a receiver circuit 122 (RX) for receiving, local bus messages over the local bus 300.

In the exemplary embodiment from FIG. 1, a circuit 130 of the coupler 100 is implemented between the first interface 110 and the second interface 120. The circuit 130 is implemented on a circuit board, for example, and can have a number of integrated circuits. The circuit 130 has an input circuit 172, which is connected to the first interface 110. In the exemplary embodiment from FIG. 1, the input circuit 172 is equipped to extract and temporarily store process data from a field bus message. The input circuit 172 is connected to a DMA controller 170 and to registers 150 over an M-bit wide parallel bus 171. The parallel bus 171 has a bit width of, e.g., 16 bits or 32 bits. The parallel bus 171 can likewise be connected to an arithmetic logic unit, processor 173. Complex program control is possible by means of the processor 173. For example, the processor 173 can enable the coupler 100 to control the automation system 1 as a programmable logic controller. In this case, no separate PLC 210 would be necessary. It is possible to integrate the circuit 130 of the coupler 100 into a semiconductor chip. For example, the circuit 130 can be implemented in an FPGA or ASIC.

Process data from the registers 150 arrive in a non-clocked logic circuit 140 for changing the process data. In the exemplary embodiment from FIG. 1, the changing of the process data takes place within a single clock period of a clock signal generated by a clock source of the circuit 130. A number of significant advantages is achieved through the changing of the process data by means of the non-clocked logic circuit 140. By means of the non-clocked logic circuit 140 it is possible to achieve an especially low latency that is no higher than in the case of couplers that do not permit changing of the process data, so improved real-time functionality is achieved with the non-clocked logic circuit 140. Because of the changing of the process data, a number of new functions can be added in live operation that previously were only possible through the inclusion of a processor and a computation by a software program in the processor. For example, in continuous operation the process data for a newly added local bus node can initially be changed such that a test mode of only this newly added local bus node is started. In so doing, all functions including the connections for inputs and outputs of the newly added local bus node are tested in continuous operation before the newly added local bus node is queried by another field bus device 210, 220, 230 or outputs of the added local bus node are switched by another field bus device 210, 220, 230. Furthermore, it is also possible to change all process data 353 for the local bus message 350, for example in order to reduce the EMC-relevant radiation of the local bus 300.

The non-clocked logic circuit 140 is connected to a FIFO 160 for temporarily storing the changed process data. The FIFO 160 is connected at its output side to an output circuit 174, wherein the output circuit 174 is connected to the second interface 120. The output circuit 174 is equipped to generate the local bus message. In this process, the changed process data are inserted by the output circuit 174 into the local bus message. As an alternative to the FIFO 160 shown, a different memory element, for example a buffer, can also be provided.

Figure 2:
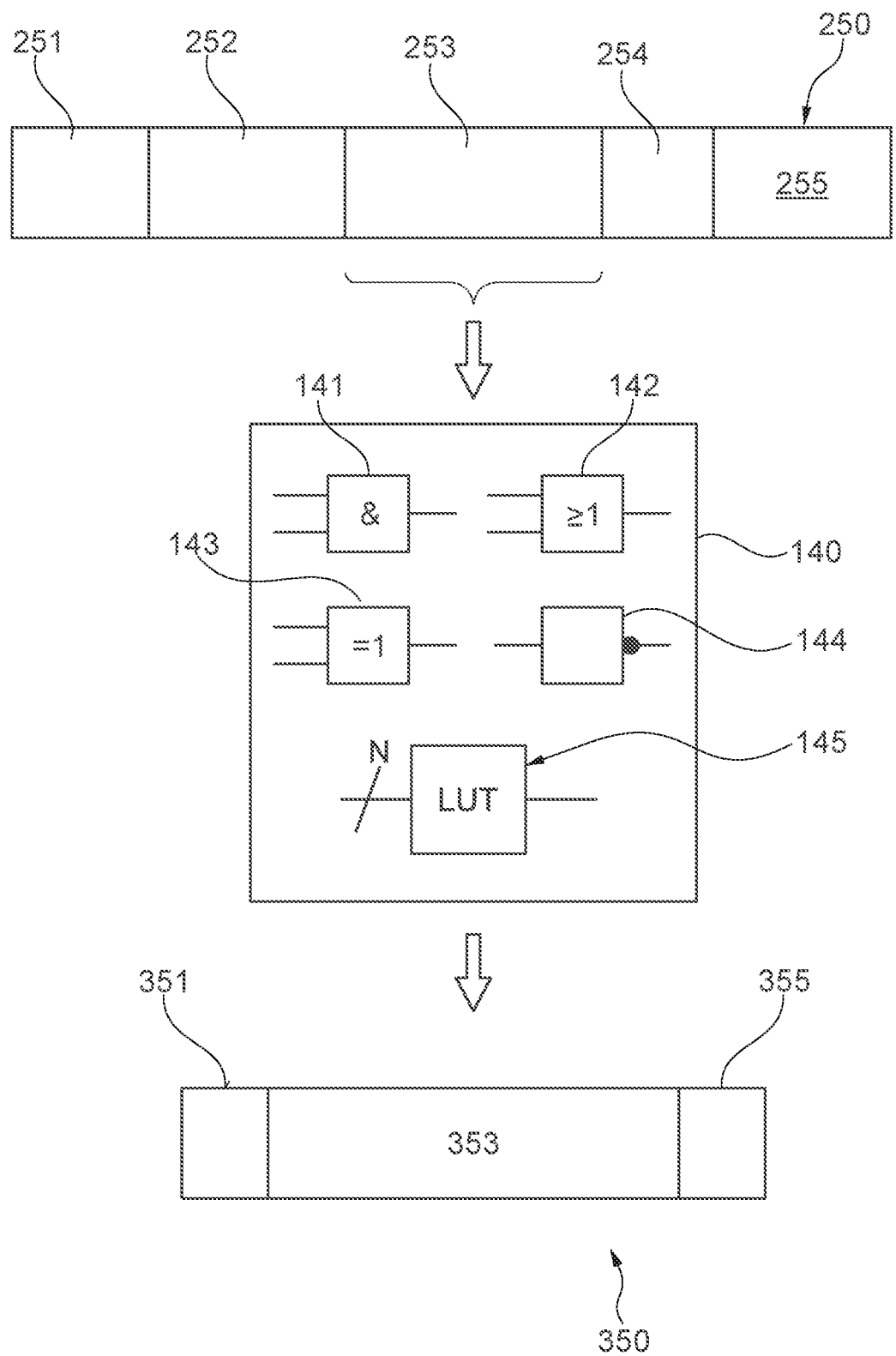
FIG. 2 is a schematic diagram of an exemplary embodiment with a field bus message and a local bus message.

FIG. 2 shows a schematic diagram that schematically represents a field bus message 250 and a local bus message 350. The field bus message 250 of the exemplary embodiment from FIG. 2 has a header 251, process data 253, and additional data areas 252, 254, and a trailer 255. The trailer 255 can contain check values (CRC), for example. The received process data 253 are individual data items for a multiplicity of the local bus nodes 310, 320, 330, 340.

The process data 253 are taken from the field bus message 250 and changed by the schematically depicted non-clocked logic circuit 140. The non-clocked logic circuit 140 in the exemplary embodiment from FIG. 2 has an AND gate 141 and/or an OR gate 142 and/or an exclusive-OR gate 143 and/or an inverter 144 and/or an LUT (Look-Up-Table) 145 or any desired combination of several of the stated hardware logic elements. The logic function formed here from the hardware logic elements 141, 142, 143, 144, 145 depends on the complexity of the change to the process data that is implemented.

The changed process data 353 are inserted into the local bus message 350. To generate the local bus message 350 in the exemplary embodiment from FIG. 2, a header 351 and a trailer 355 are created between which the changed process data 353 are inserted. The trailer 355 can contain check values (CRC), for example. Every local bus node 310, 320, 330, 340 is equipped to extract the individual data associated with it from the local bus message 350 (summation frame protocol). At least a part of this individual data is changed by the non-clocked logic circuit. FIG. 2 is a simplified representation in this regard. It is known to the person skilled in the art that considerably more complex local bus messages can also be provided.

Figure 3:
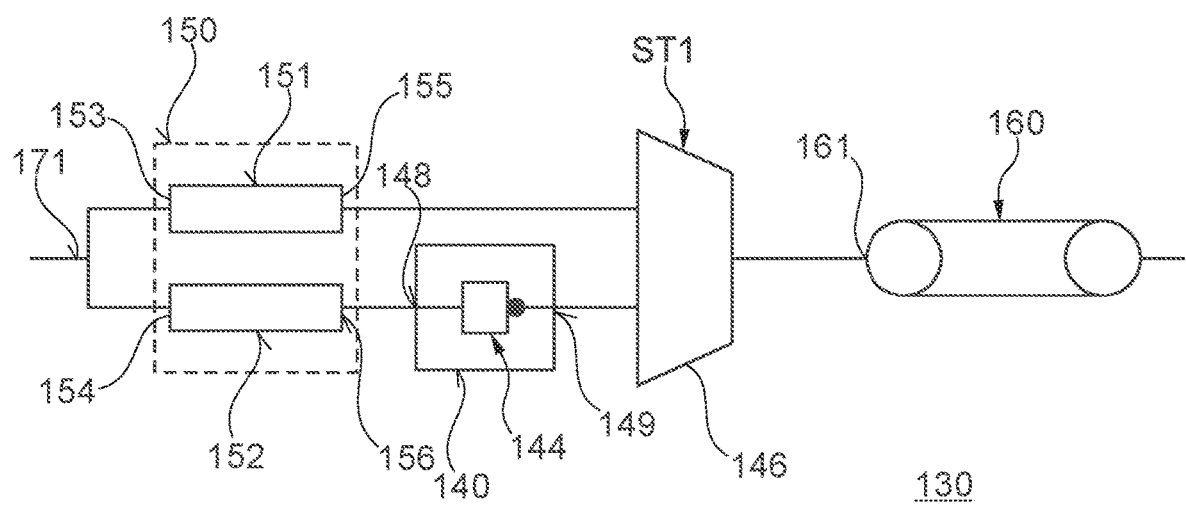
FIG. 3 is a section of a schematic circuit diagram of an exemplary embodiment of a coupler.

FIG. 3 schematically shows a section of a circuit diagram of a circuit 130 of the coupler 100. The circuit 130 has a register 152 in the memory region 150. An output 156 of the register 152 is directly connected to an input 148 of the non-clocked logic circuit 140. In the exemplary embodiment from FIG. 3, as an especially simple example, the non-clocked logic circuit 140 is designed as an inverter, so that each bit that is output at the output 156 of the register 152 is inverted. Each inverted bit arrives through the multiplexer 146 at an input 161 of a FIFO 160. In an alternative embodiment from FIG. 3, a different non-clocked logic circuit 140 is provided, for example by means of LUT and transmission gates, which also permit more complex combinatorics. For example, a re-sorting of bits of the process data can be accomplished by the non-clocked logic circuit 140.

The circuit 130 has an additional register 151 in the memory region 150 and a switching unit 146. In the exemplary embodiment from FIG. 3, the switching unit is implemented as a multiplexer 146. By means of the multiplexer 146, a switching takes place between the output signal at the output 149 of the non-clocked logic circuit 140 and the output signal at the additional output 155 of the additional register 151. To this end, a first input of the multiplexer 146 is connected to the additional output 155 of the additional register 151. The circuit 130 is equipped to switch between the additional output 155 of the additional register 151 and the output 149 of the non-clocked logic circuit 140 by means of a control signal ST1 at a control input of the multiplexer 146. The control signal ST1 is generated, e.g., by the registers 151 and 152 (strobe signal) when new data are present in the applicable register 151, 152. At the same time, the FIFO 160 can be controlled therewith to load in the changed or unchanged process data. As an alternative to the FIFO 160, a different memory element, as for example a buffer, can also be provided.

The registers 151, 152 are connected to a parallel bus 171 in the exemplary embodiment from FIG. 3. Accordingly, one register 152 and one additional register 151 are provided for each bit of the M-bit wide parallel bus 171. Accordingly, twice 16 registers 151, 152 are present in the case of a 16-bit wide parallel bus 171, so that a 16-bit process data word is completely read into a 16-bit wide register. The exemplary embodiment from FIG. 3 permits an especially simple implementation. Thus, in the exemplary embodiment from FIG. 3, the control of whether or not the process data are to be changed can take place very simply through addressing of the associated register 151, 152 so that the controller can easily control the changing of the process data. The exemplary embodiment in FIG. 3 shows an especially advantageous possibility for easily controlling the changing or NON-changing of the process data through the addressing. The addressing can take place by means of linked lists, for example, wherein a descriptor contains, e.g., a source and a destination and also a pointer for the next step. Although the controller, in particular the DMA controller, does not itself have a non-clocked logic circuit for changing the process data, the DMA controller can nevertheless control the changing of the process data using this embodiment in FIG. 3. A standard DMA controller can thus be used, which need not have any special design for the changing of the process data, and can be commensurately simple in design.

As an alternative to the exemplary embodiment from FIG. 3, the output 149 of the non-clocked logic circuit 140 is connected directly to the input 161 of the FIFO 160. Moreover, in this case the output 155 of the additional register 151 can be connected to the FIFO 160. The control of the FIFO 160 takes place here by means of two control inputs, so that the data at the output 149 of the non-clocked logic circuit 140 or the data at the output 155 of the additional register 151 can be selectively loaded into the FIFO 160.

Figure 4:
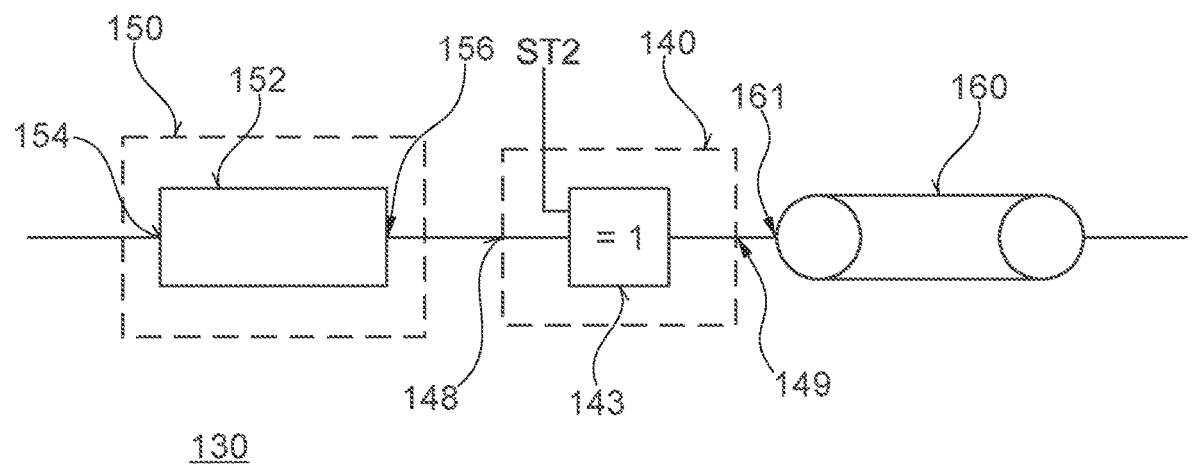
FIG. 4 is a section of a schematic circuit diagram of an exemplary embodiment of a coupler.

Shown in FIG. 4 as an additional exemplary embodiment is a section of a circuit diagram of a circuit 130 of a coupler 100. In the exemplary embodiment from FIG. 4, a register 152 is provided whose output 156 is connected to an input 148 of the non-clocked logic circuit 140. The output 149 of the non-clocked logic circuit 140 is connected to an input 161 of the FIFO 160. The non-clocked logic circuit 140 here has a logic function that is switchable by the control signal ST2. The exemplary embodiment from FIG. 4 shows an especially simple implementation in that the non-clocked logic circuit 140 has an exclusive-OR gate. In one embodiment, the switching signal ST2 for the non-clocked logic circuit 140 is composed of an LSB (LSB—Lowest Significant Bit) of the address for addressing the register 152.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A coupler for an automation system for controlling a process, the coupler comprising:
    a first interface for connection to a field bus for receiving a field bus message with process data of the process, the first interface having a first interface circuit adapted to a protocol or a physical characteristic of the field bus by converting the process data from the protocol or the physical characteristic of the field bus;
a second interface for connection to a local bus for transmitting a local bus message with a changed process data of the process, the second interface having a second interface circuit adapted to a protocol or a physical characteristic of the local bus by converting the changed process to the protocol or the physical characteristic of the local bus, wherein the protocol or the physical characteristic of the local bus are different from that of the field bus; and
a circuit arranged between the first interface and the second interface,
wherein the circuit has a non-clocked logic circuit comprising at least one hardware logic element,
wherein the non-clocked logic circuit is equipped to change process data received through the first interface,
wherein the circuit is equipped to output the changed process data in the local bus message,
wherein the non-clocked logic circuit as a hardware logic element comprises:
an AND gate;
an OR gate;
an exclusive-OR gate;
an inverter; or
a lookup table; or
a combination thereof, and
wherein the second interface is equipped to generate the local bus message by creating a header and a trailer and by inserting the changed process data between the header and the trailer.

2. The coupler according to claim 1, wherein the circuit has a memory element,
wherein an output of the non-clocked logic circuit is connected to an input of the memory element, and
wherein the circuit is equipped to load the changed process data in the memory element and output the changed process data loaded in the memory element in the local bus message.

3. The coupler according to claim 2, wherein the memory element is a FIFO.

4. The coupler according to claim 1, wherein the circuit is equipped to switch between changed process data and unchanged process data for output in the local bus message.

5. The coupler according to claim 4, wherein the output of the non-clocked logic circuit is connected via a switching unit, in particular a multiplexer, to the input of the memory element.

6. The coupler according to claim 4, wherein the output of the non-clocked logic circuit is connected to the input of the memory element.

7. The coupler according to claim 1, wherein the circuit has a register, and
wherein an output of the register is connected to an input of the non-clocked logic circuit.

8. The coupler according to claim 7, wherein the circuit has an additional register,
wherein the circuit has a switching unit,
wherein a first input of the switching unit is connected to an output of the additional register, and
wherein the circuit is equipped to switch between the output of the additional register and the output of the non-clocked logic circuit by means of a control signal at a control input of the switching unit.

9. The coupler according to claim 7, wherein the circuit has an M-bit wide parallel bus,
wherein the register and/or the additional register are connected to the parallel bus, and
wherein the circuit is equipped to copy at least sections of the received process data into the register and/or the additional register via the parallel bus.

10. The coupler according to claim 9, wherein the circuit has a controller or a DMA controller for controlling the copying.

11. The coupler according to claim 1, further comprising:
a plurality of devices connected to the field bus; and
a plurality of devices connected to the local bus,
wherein the plurality of devices connected to the field bus communicate with the plurality of devices connected to the local bus exclusively through the coupler.

12. The coupler according to claim 1, further comprising:
a field bus device connected to the field bus; and
a local bus device connected to the local bus,
wherein the field bus device communicates with the local bus device exclusively through the coupler.

13. The coupler according to claim 1, wherein the local bus has a mode of transmission that is different from that of the field bus.

14. The coupler according to claim 1, further comprising a programmable logic circuit connected to the field bus.

15. The coupler according to claim 1, wherein the local bus is implemented as a logical ring bus structure.

16. The coupler according to claim 1, wherein the non-clocked logic circuit is configured to change the process data within a single clock period of a clock signal generated by a clock source of the circuit.

17. The coupler according to claim 1, wherein the non-clocked logic circuit as a hardware logic element comprises:
an AND gate;
an OR gate;
an exclusive-OR gate;
an inverter; and
a lookup table.

18. An automation system for controlling a process, the system comprising:
a field bus;
a local bus; and
a coupler connecting the field bus to the local bus, the coupler comprising:
a first interface for connection to a field bus for receiving a field bus message with process data of the process, the first interface having a first interface circuit adapted to a protocol or a physical characteristic of the field bus by converting the process data from the protocol or the physical characteristic of the field bus;
a second interface for connection to a local bus for transmitting a local bus message with a changed process data of the process, the second interface having a second interface circuit adapted to a protocol or a physical characteristic of the local bus by converting the changed process to the protocol or the physical characteristic of the local bus, wherein the protocol or the physical characteristic of the local bus are different from that of the field bus; and
a circuit arranged between the first interface and the second interface, the circuit comprising a non-clocked logic circuit comprising a hardware logic element,
wherein the non-clocked logic circuit is equipped to change process data received through the first interface,
wherein the circuit is equipped to output the changed process data in the local bus message, wherein the non-clocked logic circuit as a hardware logic element comprises:
an AND gate;
an OR gate;
an exclusive-OR gate;
an inverter; or
a lookup table; or
a combination thereof, and
wherein the second interface is equipped to generate the local bus message by creating a header and a trailer and by inserting the changed process data between the header and the trailer.

19. The automation system for controlling a process according to claim 18, wherein the non-clocked logic circuit as a hardware logic element comprises:
an AND gate;
an OR gate;
an exclusive-OR gate;
an inverter; and
a lookup table.

20. A coupler for an automation system for controlling a process, the coupler comprising:
a first interface for connection to a field bus for receiving a field bus message with process data of the process, the first interface having a first interface circuit adapted to a protocol or a physical characteristic of the field bus by converting the process data from the protocol or the physical characteristic of the field bus;
a second interface for connection to a local bus for transmitting a local bus message, the second interface having a second interface circuit adapted to a protocol or a physical characteristic of the local bus by converting the changed process to the protocol or the physical characteristic of the local bus, wherein the protocol or the physical characteristic of the local bus are different from that of the field bus; and
a circuit arranged between the first interface and the second interface,
wherein the circuit has a non-clocked logic circuit comprising a plurality of hardware logic elements,
wherein the non-clocked logic circuit is equipped to change process data received through the first interface, and
wherein the second interface is equipped to generate the local bus message by creating a header and a trailer and by inserting the changed process data between header and trailer.

* * * * *